(12) United States Patent
Witter (10) Patent No.: US 8,890,520 B2
(45) Date of Patent: Nov. 18, 2014

(54) METHOD FOR EXAMINING THE NUCLEAR MAGNETIC RESONANCE IN A SAMPLE AND DEVICE FOR CARRYING OUT THE METHOD

(75) Inventor: Raiker Witter, Karlsruhe (DE)

(73) Assignee: Karlsruhe Institute of Technology (KIT), Karlsruhe (DE)

( * ) Notice: Subject to any disclaimer, the term of this patent is extended or adjusted under 35 U.S.C. 154(b) by 456 days.

(21) Appl. No.: 13/391,584

(22) PCT Filed: Aug. 17, 2010

(86) PCT No.: PCT/EP2010/005034
§ 371 (c)(1),
(2), (4) Date: Feb. 21, 2012

(87) PCT Pub. No.: WO2011/020590
PCT Pub. Date: Feb. 24, 2011

(65) Prior Publication Data
US 2012/0146635 A1 Jun. 14, 2012

(30) Foreign Application Priority Data
Aug. 21, 2009 (DE) .......................... 10 2009 038 472

(51) Int. Cl.
*G01R 33/62* (2006.01)
(52) U.S. Cl.
CPC .................................... *G01R 33/62* (2013.01)
USPC ........................................................ 324/304
(58) Field of Classification Search
CPC ........ G01R 33/24; G01R 33/26; G01R 33/44; G01R 33/60; G01R 33/62; G01R 33/032; G01R 33/302; G01R 33/323; G01V 3/00; G01V 3/15
USPC ................................................. 324/300–322
See application file for complete search history.

(56) References Cited

U.S. PATENT DOCUMENTS

| 3,434,072 A | * | 3/1969 | Milton | 372/72 |
| 5,189,368 A | * | 2/1993 | Chase | 324/304 |

(Continued)

FOREIGN PATENT DOCUMENTS

WO WO-2009/090610 7/2009

OTHER PUBLICATIONS

Helseth et al., "Strongly Focused Electromagnetic Waves in EXE<*> Media Optics Communications," vol. 281, No. 23, pp. 5671-5673, Dec. 1, 2008.

(Continued)

*Primary Examiner* — Dixomara Vargas
(74) *Attorney, Agent, or Firm* — Venable LLP; Robert Kinberg (57) ABSTRACT

Nuclear magnetic resonance in a sample volume located in a measuring volume is examined by generating a packet of laser pulses to act on the measuring volume when a quasi-static magnetic field occurs therein. If the resonance conditions for nuclear spins contained therein are fulfilled, the sample volume emits a response signal that is received by a detector. The quasi-static magnetic field occurring within the measuring volume is generated by acting on the measuring volume with a low-frequency laser beam having a wavelength that exceeds the wavelength of the excitation laser by at least $10^2$ to create a periodically variable magnetic field in the measuring volume. The amplitude of the field is at least 90% of the maximum thereof in the measuring volume. Alternatively, the measuring volume is acted on by a high-frequency laser beam having a frequency exceeding the frequency of the excitation laser by at least $10^2$. The laser beam is subjected to rectification before acting on the measuring volume to create a quasi-static magnetic field in the measuring volume having an effective mean constant flux density over at least 10 periods, wherein the spatial and time average of the flux density are not equal to zero.

8 Claims, 8 Drawing Sheets

(56) References Cited

U.S. PATENT DOCUMENTS

| | | | |
|---|---|---|---|
| 5,210,764 A * | 5/1993 | Bucher et al. | 372/23 |
| 6,816,266 B2 * | 11/2004 | Varshneya et al. | 356/477 |
| 6,911,646 B1 * | 6/2005 | Weitekamp | 250/234 |
| 7,105,811 B2 * | 9/2006 | Dantus et al. | 250/288 |
| 7,109,706 B2 * | 9/2006 | Xiang et al. | 324/300 |
| 7,388,498 B2 * | 6/2008 | Spencer et al. | 340/572.5 |
| 7,439,497 B2 * | 10/2008 | Dantus et al. | 250/288 |
| 7,450,618 B2 * | 11/2008 | Dantus et al. | 372/25 |
| 7,567,596 B2 * | 7/2009 | Dantus et al. | 372/30 |
| 7,609,731 B2 * | 10/2009 | Dantus et al. | 372/30 |
| 7,973,936 B2 * | 7/2011 | Dantus | 356/451 |
| 8,300,669 B2 * | 10/2012 | Dantus et al. | 372/25 |
| 2011/0142316 A1 * | 6/2011 | Wang et al. | 382/131 |
| 2012/0146635 A1 * | 6/2012 | Witter | 324/304 |

OTHER PUBLICATIONS

Smirnov, A.Y., "Direct Mechanism of Spin Orientation by Circularly Polarized Light," Phys. Rev. B., vol. 60, pp. 3040-3043, 1999.

Happer et al., "Light Propagation and Light Shifts in Optical Pumping Experiments," Progress in Quantum Electronics, Pergamon Press, Oxford, vol. 1, pp. 51-103, Jan. 1, 1970.

Sutter, D. et al., "Laser Excitation and Detection of Magnetic and Optical Resonance," Advances in Magnetic and Optical Resonance, vol. 16, pp. 1-83, 1991.

Anonymous, "The Giant Force of Ultrashort-Pulsed Light" (Online) 2010.

Kimel, A.V., et al., "Femtosecond Opto-Magnetism: Ultrafast Laser Manipulation of Magnetic Materials," Laser & Photon. Rev., vol. 1, pp. 275-287, 2007.

* cited by examiner

METHOD FOR EXAMINING THE NUCLEAR MAGNETIC RESONANCE IN A SAMPLE AND DEVICE FOR CARRYING OUT THE METHOD

CROSS-REFERENCE TO RELATED APPLICATIONS

This application is a U.S. National Stage of International Application No. PCT/EP2010/005034 filed Aug. 17, 2010, designating the United States and claiming priority to German Application No. DE 102009038472.3 filed Aug. 21, 2009.

BACKGROUND OF THE INVENTION

The invention relates to a method for examining the interaction between molecules and electromagnetic fields with the aid of nuclear magnetic resonance (NMR), as well as to a device for realizing said method.

The nuclear magnetic resonance spectroscopy and the imaging based thereon, which is also referred to as MRI (magnetic resonance imaging), makes it possible to characterize the molecular properties and to identify the atomic components of a sample, based on the interactions between magnetic fields and the molecules contained in a sample.

Pulsed, high-frequency fields with amplitudes of up to 100 T are used for generating external magnetic fields which are necessary for realizing the aforementioned method, for example see "Concepts in Magnetic Resonance 19B, 2003, page 9. To be sure, magnetic fields with higher amplitudes would be desirable, but cannot be achieved in this way. The sensitivity of the method using nuclear magnetic resonance is subject to the Boltzman Statistics and increases with increasing flux density. At room temperature and with a flux density of approximately 20 T, only one of approximately $10^5$ atomic cores contributes to the signal. The magnetic field gradients which are additionally required for the local resolution are too low below the μm range for the microscopy/nanoscopy and for the micro-spectroscopy/nano-spectroscopy.

According to the document by D. Suter and J. Mlynek, *Laser Excitation and Detection of Magnetic Resonance*, Adv. in Magn. and Opt. Resonance, 16, pp 1-12, 1991, atomic cores located in a constant magnetic field experience a break in symmetry which results in the Zeemann splitting. The consequently formed energy levels can be optically excited, manipulated and detected with respect to their fine structure. The use of a laser in this case opens up the option of examining new properties, e.g. relating to a different spatial expansion, band width or induced emission.

SUMMARY OF THE INVENTION

It is therefore an object of the present invention to provide a method for examining the nuclear magnetic resonance in a sample, as well as a device for realizing said method, which make possible a high resolution during the examination of the nuclear magnetic resonance as well as for the imaging.

Another object of the present invention in particular is to provide magnetic fields with extremely high flux densities, as well as magnetic field gradients with extremely high gradient slopes.

Radiation sources which emit synchronized, monochromatic electro-magnetic radiation with high spatial and time coherence generate magnetic fields with high flux density and amplitude, as well as magnetic field gradients with high slopes. Suitable lasers are available for the frequency range of $10^7$ to $10^{15}$ Hz, which is of importance for the present invention, wherein these lasers also include the radiation sources referred to as "masers" in the microwave range. Depending on the selected frequency range, the lasers include masers, tetra-hertz lasers, IR lasers, lasers for the visible spectral range or UV lasers. With the aid of these radiation sources and based on their high intensities and frequencies, it is possible to generate magnetic fields with an amplitude in the range of $10^4$ T to $10^8$ T, as well as magnetic field gradients with steep slopes in the nanometer (nm) range. Changes in the nuclear spin of individual atoms can be detected in this way.

The method according to the invention comprises the steps a) to c). According to step a), a suitable laser which is called an excitation laser generates at least one packet of laser pulses. However, in practical operations this means a cascade of packets of laser pulses.

According to step b), the at least one packet of laser pulses is radiated in such a way that it impinges on the measuring volume, containing the sample volume, at a point in time when a quasi-static magnetic field≠0 (zero) occurs within the measuring volume. This condition ensures that precisely at the time when a quasi-static magnetic field is present, in the measuring volume on the time scale of the frequency of the excitation laser, the sample is subjected approximately at the same time also to a laser pulse which generates a time-variable magnetic field with a flux density $B_1$.

The basic requirement for the detection of a response signal from the sample volume is that the frequency requirement is met, meaning according to the so-called Larmor relationship, for the energetic excitation of nuclear spin levels with an energy difference $\Delta E$ resulting from an excitation frequency $f_{1j}=2\pi\cdot\omega_{1j}$, radiated onto the atomic cores, according to:

$$\Delta E = \hbar \gamma_{nucleus} B_{0i} = \hbar \omega_{1j} = h f_{1j} \tag{1}$$

wherein $\hbar$ represents the Planck's Constant, $\gamma_{nucleus}$ represents the gyro-magnetic moment when the atomic nucleus is hit, and $B_{0i}$ refers to the flux density of a (quasi) static (external) magnetic field.

If at least some of the nuclear spins contained in the sample meet the resonance requirements according to the equation (1), then the sample which is contained in the existing, quasi-static magnetic field will transmit as a result of each irradiated excitation laser pulse a response signal with the energy $\Delta E$. According to step c), this response signal is received by at least one detector and is preferably transmitted to a data processing system for the further processing.

The magnetic field that appears within the measuring volume is quasi-static within the measuring volume, relative to the time scale for the frequency of the excitation laser, if it changes by a factor of $10^2$, preferably $10^3$, either slower or faster than the frequency of the excitation laser.

For the case i) where the magnetic field changes slowly with respect to the time scale for the frequency of the excitation laser, it is ensured in the following manner that a value≠0 is always present for the flux density $B_{01}$ of the quasi-static magnetic field which enters into the resonance requirements according to the equation (1).

According to the measure i), a suitable laser that is referred to as field laser generates a low-frequency first laser beam for this. The wavelength of the low-frequency first laser beam is selected such that it exceeds the wavelength of the excitation laser by at least a factor of $10^2$, preferably $10^3$.

According to one embodiment, a field laser is used for this which emits a low-frequency first laser beam with a wavelength of $10^7$ Hz to $10^{13}$ Hz while the at least one packet of laser pulses is generated by an excitation laser having a frequency of $10^9$ to $10^{15}$ Hz.

The low-frequency first laser beam impinges on the measuring volume with therein located sample volume to be examined. As a result, a first periodic magnetic field with a flux density $B_{01}$ is generated in the measuring volume, wherein the amplitude of the magnetic field within the measuring volume measured at least 90%, preferably 95%, of its maximum. The value for the amplitude is determined according to the following:

$$I_{0i} = \frac{1}{2} \cdot \frac{1}{\mu_0} |B_{01}2|c \qquad (2)$$

$$I_{0T} = \frac{1}{2} \left| B \frac{2}{01} \right| c$$

wherein $\mu_0$ represents the magnetic field constant and c represents the speed of light.

For the case ii) for which the magnetic field changes quickly with respect to the time scale for the frequency of the excitation laser, an average vanishing effective flux density $B_{01eff}=0$ of the quasi-static magnetic field initially exists, so that no response signal from the sample volume can be observed according to the equation (1).

To obtain nevertheless a quasi-static magnetic field with an effective flux density≠0, the measuring volume is admitted according to the measure ii) with a high-frequency first laser beam, for which the frequency exceeds the frequency of the excitation laser by at least a factor of $10^2$ and preferably $10^3$. It is critical for this case ii) that the high-frequency first laser beam is rectified prior to impinging on the measuring volume. As a result, a quasi-static magnetic field is generated in the measuring volume which has an effective average constant flux density $B_{01eff}$ over at least 10 periods, for which the spatial and time average is≠0 (zero). The wave forms required for this can be composed of several frequency components, in the same way as for the Fourier analysis.

Whereas according to another embodiment, the at least one packet of laser pulses is generated by an excitation laser having a frequency of $10^7$ to $10^9$ Hz, a field laser is simultaneously also used with emits a high-frequency first laser beam with a wavelength of $10^7$ to $10^{11}$ Hz and is subjected to a standard and known electronic rectification before it irradiates the measuring volume. Even though the measure ii) is in principle also suitable for higher frequencies, no rectifier is presently known for the optical spectral range.

One embodiment of the method according to the invention is configured such that in the measuring volume at least one additional quasi-static magnetic field with the flux density $B_{0i}$ with i=1, 2, . . . is generated in addition to the already existing quasi-static magnetic field.

At least one additional laser beam is generated for this according to the further step a'), for which the wavelength corresponds to the wavelength of the low-frequency first laser beam according to the measure i). However the phases of the at least one additional laser beam differ from the phase of the low-frequency first laser beam by 90°±5°, preferably by 90°±1°, so that the flux density $B_{0i}$ of the at least one additional laser beam shows a zero crossing in the measuring volume and thus the highest possible gradient if the flux density of the quasi-static magnetic field according to the measure i) shows a maximum in the measuring volume.

In the case of the measure ii) for which a low-frequency first laser beam according to the measure i) has not yet been used, at least one additional low-frequency laser beam can still be generated in an analogous manner, wherein this beam has a zero crossing in the measuring volume and thus the highest possible gradient.

According to one embodiment, the first laser beam and the existing additional laser beams are oriented parallel to each other.

According to yet another embodiment, existing additional laser beams are respectively oriented orthogonal to the first laser beam. Based on the three-dimensionality in space, it is thus possible with two additional laser beams, arranged orthogonal to each other, to generate gradients in all x and y directions if the z direction functions as the oscillating direction for the quasi-static magnetic field generated by the first laser beam.

The at least one additional laser beam is generated either with the aid of one or several additional field lasers which respectively emit a suitable wavelength or is branched off with the aid of at least one beam divider, arranged in the beam path, and a Π/2 delay line (phase shifter) from the first laser beam with the same wavelength.

With this embodiment, the at least one additional laser beam admits the measuring volume, thereby generating in the measuring volume at least one additional, periodically changeable magnetic field with a flux density $B_{0i}$ with i=1, 2, . . . and respectively one gradient. If during the step b) a laser pulse with time-variable magnetic field and a flux density of $B_1$ impinges on the measuring volume, the additional existence of the quasi-static magnetic field gradient makes possible an imaging (MRI) for which the resolution is limited only by the slope of the gradient itself.

We want to point out that the sample must be at least partially transparent or reflecting in the frequency ranges for the laser beams and laser pulses which impinge on the sample, so that a detectable response signal can be generated.

The invention furthermore relates to a device for realizing the method according to the invention and comprises at a minimum the following:

at least one field laser for generating a first laser beam;
an excitation laser for generating laser pulses, wherein the frequency of the excitation laser exceeds the frequency of the first laser beam by at least a factor of $10^2$ or wherein the wavelength of the excitation laser exceeds the wavelength of the first laser beam by at least a factor of $10^2$;
means for controlling the relative phase between the field laser and the excitation laser, in particular a trigger; and
means for guiding the first laser beam and the laser pulses along a radiation path onto a measuring volume that contains a sample.

According to one embodiment, a beam divider and a Π/2 delay line are arranged in the beam path, so that the output beam of a field laser can be divided into at least two laser beams which are then phase-displaced by Π/2.

The method according to the invention and the device suitable for realizing said method permit the generating of local magnetic fields and magnetic field gradients with extremely high flux densities. The consequently achieved gain in sensitivity permits nuclear magnetic resonance examinations even on individual atomic cores.

BRIEF DESCRIPTION OF THE DRAWINGS

The method according to the invention and the device required for realizing the method are illustrated in the following with exemplary embodiments and the Figures, which show in detail.

DETAILED DESCRIPTION

Figure 1:
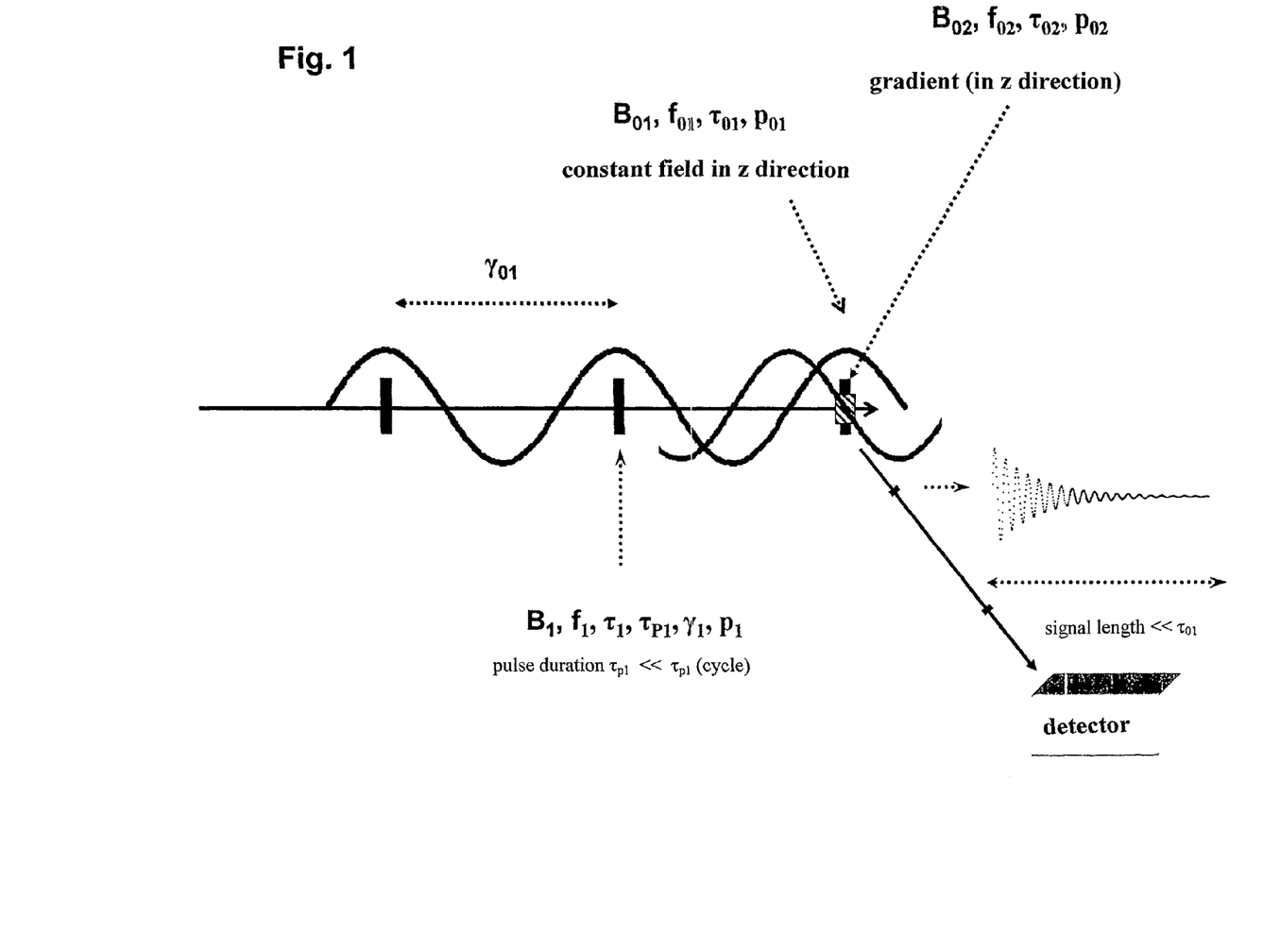
FIG. 1 The general measuring principle according to the measure i)

The principle of the invention when using the measure i) is shown schematically in FIG. 1. The first laser beam with a frequency $f_{01}$, a cycle duration $\tau_{01}$, and a wavelength $\gamma_{01}$ irradiates the measuring volume. As a result, a quasi-static magnetic field with a flux density $B_{01}$ forms in z direction across the measuring volume on the time scale for the laser pulses, mentioned below.

Furthermore, in FIG. 1 an additional laser beam with a frequency $f_{02}$, a cycle duration $\tau_{02}$ and a wavelength $\gamma_{02}$ irradiates the measuring volume in the direction of the first laser beam, thereby causing an additional magnetic field with a flux density $B_{02}$ to form in z direction across the measuring volume on the time scale for the laser pulses. With respect to its phase, the second laser beam is offset relative to the first laser beam in such a way that a quasi-static zero crossing of the magnetic field $B_{02}$ occurs as precisely as possible in the center of the sample and/or at the location for the maximum of the magnetic field for the first laser beam. If the oscillating planes for the two magnetic fields $B_{01}$ and $B_{02}$ are located in the same plane, then the gradient for the super-imposed planes shows the highest slope at this location with a sine-shaped course for the two magnetic fields. From FIG. 1 it is obvious that depending on the frequency $f_{02}$, the cycle duration $\tau_{02}$ and the wavelength $\gamma_{02}$, the intensity of the magnetic field gradient in the measuring volume can be adjusted.

In the direction of the two laser beams, the measuring volume is then admitted with a series of laser pulses having a frequency $f_1$, a wavelength $\gamma_1$, a cycle duration $\tau_1$, a pulse duration $\tau_{p1}$ and an adjustable polarization $p_1$, such that each laser pulse impinges on the measuring volume at the location of the quasi-constant magnetic field $B_{01}$ and the strongest magnetic field gradient $$\frac{\partial B_{02}}{\partial y} = \max \text{ or } \frac{\partial B_{02}}{\partial x} = \max$$

In the process, the frequency $f_1$ is selected such that it exceeds the frequencies $f_{01}$ and $f_{02}$ of the two laser beams by at least a factor of $10^2$ and preferably $10^3$.

If the Larmor requirement according to the equation 1 is met, at least one sample volume contained within the measuring volume transmits a nuclear magnetic resonance signal in response to the impinging pulses, which signal is then detected with a detector focused onto the measuring volume.

Figure 2:
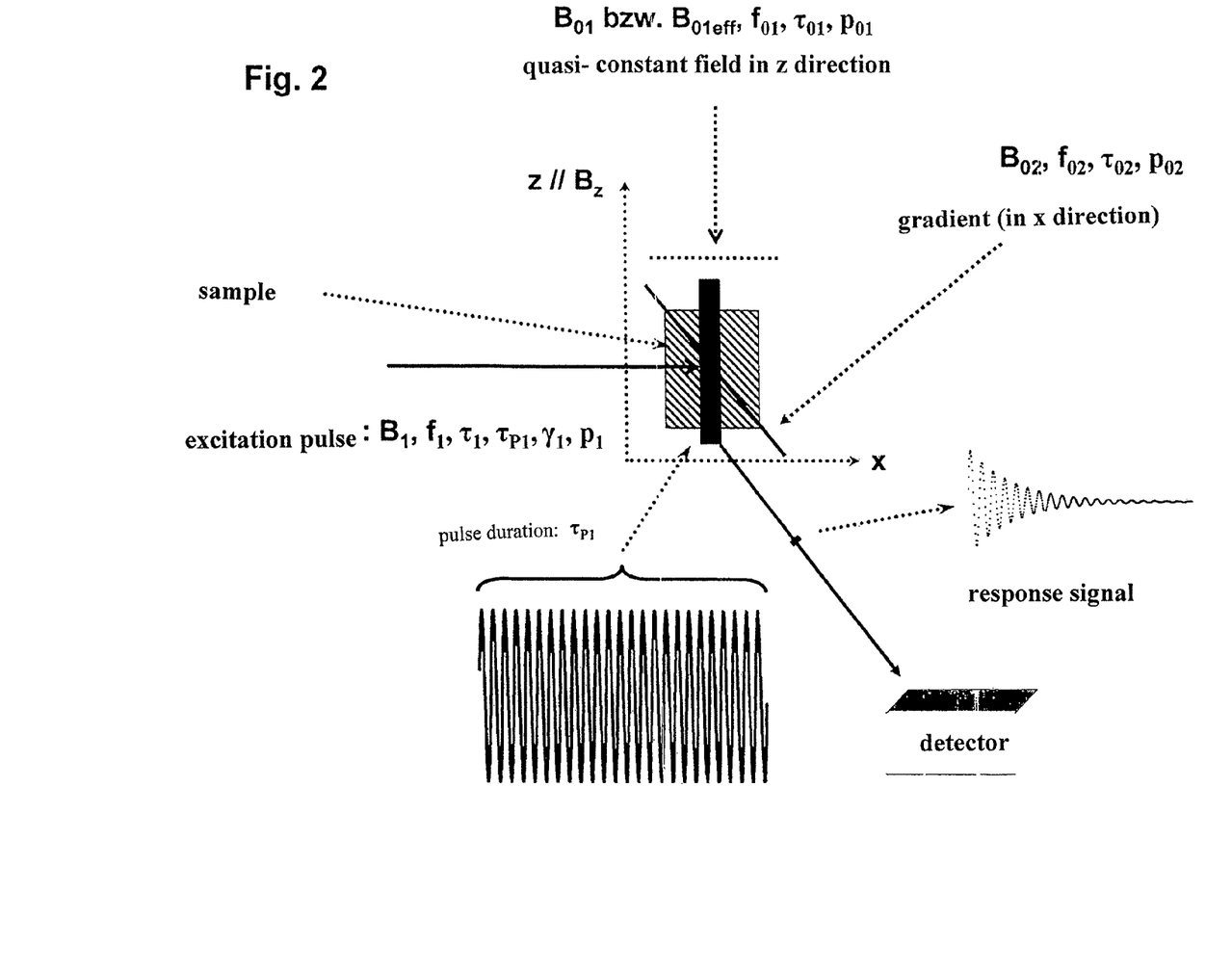
FIG. 2 An enlarged representation of FIG. 1.

FIG. 2 shows an enlarged view of the sample volume and the immediately surrounding area. The amplitude-constant input pulse with a frequency $f_1$, a cycle duration $\tau_1$, a wavelength $\gamma_1$ causes the sample volume to emit the decaying response signal, indicated on the right side of the picture, which is then detected by the detector.

Figure 3:
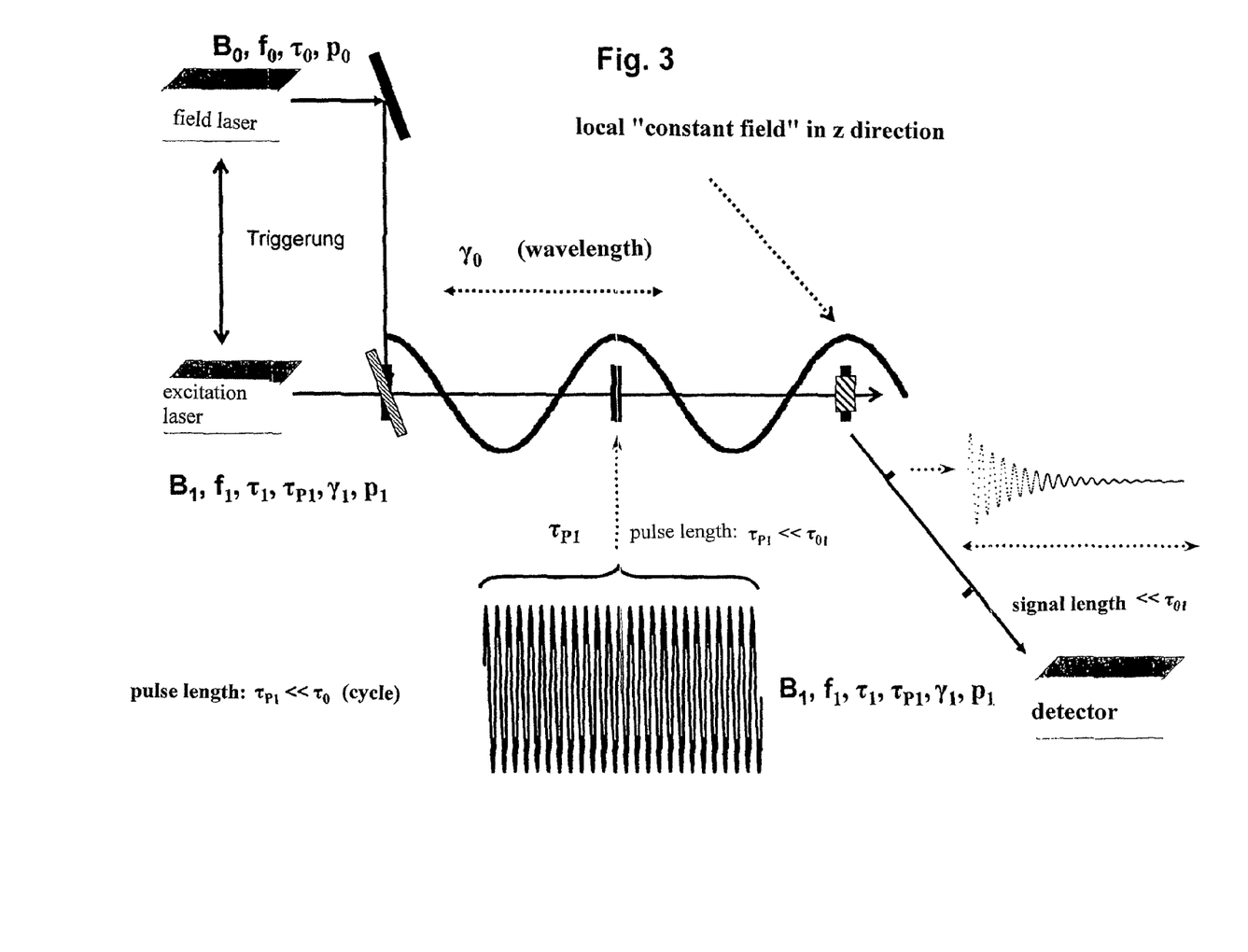
FIG. 3 A simple device for the spectroscopy according to measure i)
Figure 4:
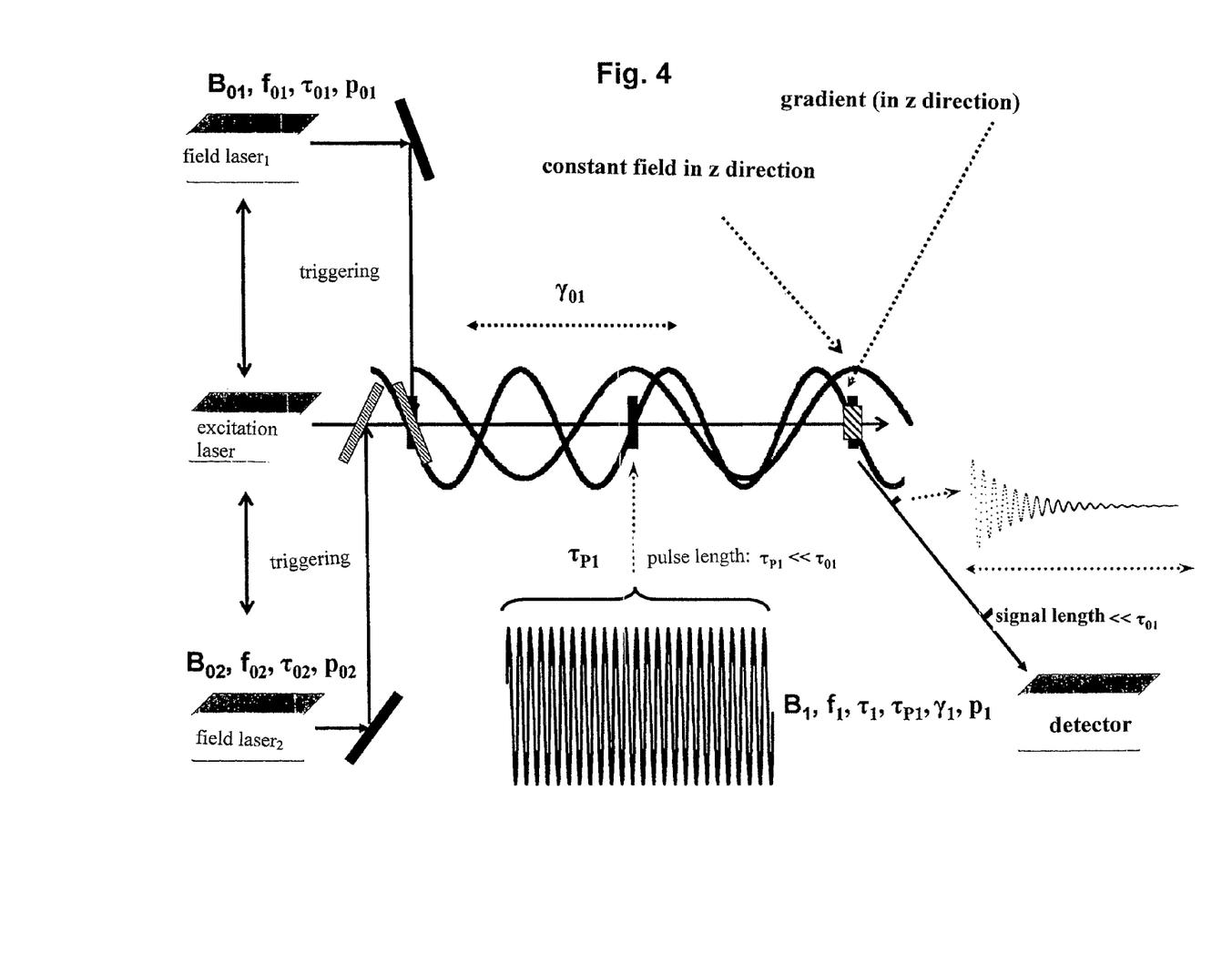
FIG. 4 A device for the micro-spectroscopy according to the measure i)

Whereas FIGS. 1, 3 and 4 respectively show a laser pulse sequence with three and/or four laser pulses entering the picture from the left side, wherein the third and/or fourth laser pulse arrive just then on the measuring volume, FIG. 2 on the other hand only shows this arriving laser pulse in an enlarged representation.

FIG. 3 shows a simplified arrangement for the micro-spectroscopy/nano-spectroscopy and/or for the microscopy/nanoscopy. The first laser beam (frequency $f_0$, cycle duration $\tau_0$, wavelength $\gamma_0$) is combined via optical media, deflection mirrors and semi-transparent mirrors, with the laser pulses (frequency $f_1$, cycle duration $\tau_1$, pulse duration $\tau_{p1}$ wavelength $\gamma_1$), so that in the measuring volume the quasi-constant magnetic field $B_{01}$, which is here oriented in z direction, and the central laser pulse act upon the sample. The laser pulse has a pulse duration that is lower by at least $10^2$ than the first laser beam. Furthermore shown are the magnetic field components $B_i$ for the laser pulses with the respectively associated frequencies $f_i$.

FIG. 4 shows the same configuration as FIG. 1, but expanded by additionally showing the radiation sources. The two field lasers for generating the first and second laser beams are shown on the top and bottom of the left side of the picture while the excitation laser for generating the laser pulses is shown in the center, as well as four laser pulses on the path toward the sample. By way of deflection mirrors and semi-transparent mirrors, the two light beams and the laser pulses are combined and focused onto the measuring volume. This beam deflection is shown as exemplary embodiment, wherein a different arrangement is possible as long as it ensures the combining and localizing of the two laser beams and the laser pulses in the volume of the sample to be examined.

A model calculation for laser fields is intended to quantitatively illustrate the functionality of the method according to the invention with respect to the measure i). For locally generating the magnetic field $B_0$ in the measuring volume range, which is quasi-constant on the time scale of the laser pulses, an IR laser with an operating frequency $f_{01}=10^{13}$ Hz is used as field laser and a pulsed UV laser ($\tau_{p1}=10^{-14}$ s) with an operating frequency of $f_1=10^{15}$ Hz is used as excitation laser.

When using the equation 1, the magnetic field intensity for the proton resonance ($\gamma_{proton}=42.5\cdot 10^6$ MHz/T) at maximum laser amplitude is:

$$B_{01} = \frac{2\pi f_1}{\gamma_{core}} \sim 150 \ MT \tag{3}$$

The laser field intensity is $$I_{01} = \frac{1}{2} \cdot \frac{c}{\mu_0}|B_{01}^2| \approx 2.6\cdot 10^{18} \frac{W}{\mu m^2} \tag{4}$$

By assuming $B_{02} \approx B_{01}$ and $\gamma_{02} \approx \gamma_{01}$, the magnetic field gradient can be estimated to be:

$$\frac{\partial \overline{B}_{02}}{\partial x_i} \approx \frac{\partial}{\partial x_1}\left(B_{01}\text{sine}\left(\frac{2\pi}{\lambda_{01}}x_i\right)\right) \approx B_{01}\frac{2\pi}{\lambda_{01}} \approx 3.1\cdot 10^7 \frac{T}{\mu m} \tag{5}$$

wherein a corresponding excitation width is necessary to excite the energy levels $$\Delta f_1 \sim 10^{-1} f_{01} = 10^{14} Hz \tag{6}$$

It is confirmed that the pulse is shorter than the cycle of $B_0$. An estimated excitation pulse (90°—pulse duration) of $10^{-14}$ s is thus obtained.

The following value is then obtained for the field intensity $B_1$ $$0.25 \approx \gamma_H B_1 \cdot 10^{-14} s \rightarrow B_1 = 590 kT. \quad (7)$$

For the intensity of the UV laser, we then obtain the following $$I_1 = \frac{1}{2} \cdot \frac{2}{\mu_0} |B_1^2| \approx 41 \frac{TW}{\mu m^2} \quad (8)$$

The following Table 1 lists the order of magnitude for several field properties with non-rectified $B_{01}$ field:

| frequencies in Hz | | magnetic fields in T | | gradient in T/μm | intensities in W/μm | |
|---|---|---|---|---|---|---|
| $f_{01}$ | $f_1$ | $B_{01}$ | $B_1$ | $\partial_x B_{02}$ | $I_{01}$ | $I_1$ |
| $10^7$ | $10^9$ | $1.5 \cdot 10^2$ | $5.9 \cdot 10^{-1}$ | $3.1 \cdot 10^{-5}$ | $2.6 \cdot 10^6$ | $4.1 \cdot 10^1$ |
| $10^8$ | $10^{10}$ | $1.5 \cdot 10^3$ | $5.9 \cdot 10^0$ | $3.1 \cdot 10^{-3}$ | $2.6 \cdot 10^8$ | $4.1 \cdot 10^3$ |
| $10^9$ | $10^{11}$ | $1.5 \cdot 10^4$ | $5.9 \cdot 10^1$ | $3.1 \cdot 10^{-1}$ | $2.6 \cdot 10^{10}$ | $4.1 \cdot 10^5$ |
| $10^{10}$ | $10^{12}$ | $1.5 \cdot 10^4$ | $5.9 \cdot 10^2$ | $3.1 \cdot 10^1$ | $2.6 \cdot 10^{12}$ | $4.1 \cdot 10^7$ |
| $10^{11}$ | $10^{13}$ | $1.5 \cdot 10^6$ | $5.9 \cdot 10^3$ | $3.1 \cdot 10^3$ | $3.1 \cdot 10^{14}$ | $4.1 \cdot 10^9$ |
| $10^{12}$ | $10^{14}$ | $1.5 \cdot 10^7$ | $5.9 \cdot 10^4$ | $3.1 \cdot 10^5$ | $3.1 \cdot 10^{16}$ | $4.1 \cdot 10^{11}$ |
| $10^{13}$ | $10^{15}$ | $1.5 \cdot 10^8$ | $5.9 \cdot 10^4$ | $3.1 \cdot 10^7$ | $3.1 \cdot 10^{18}$ | $4.1 \cdot 10^{13}$ |

Figure 5:
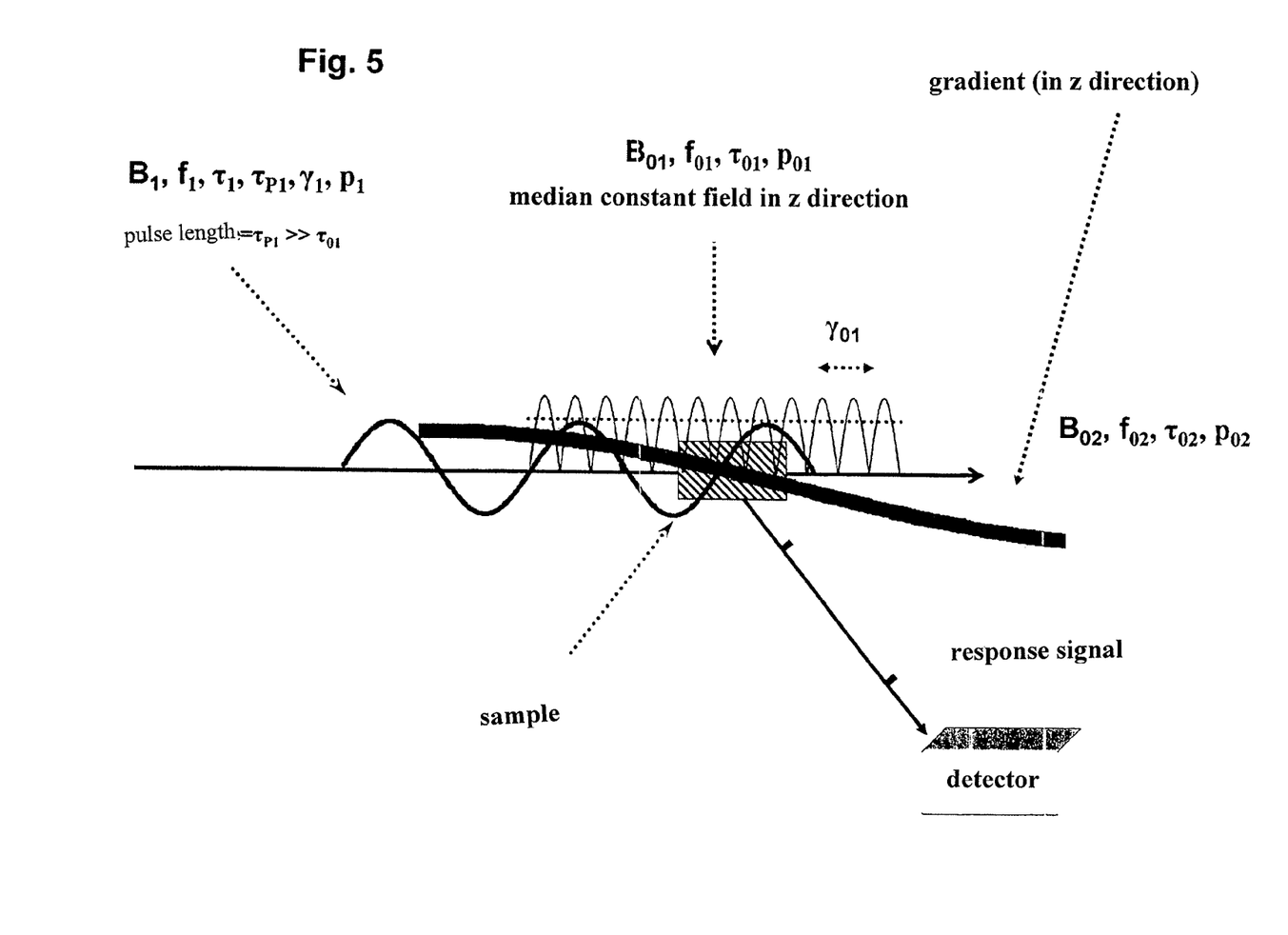
FIG. 5 The general measuring principle according to the measure ii)

By using the measure ii), the principle of the invention is illustrated schematically in FIG. 5. The first laser beam with a frequency $f_{01}$, a cycle duration $\tau_{01}$ and a wavelength $\gamma_{01}$ is rectified and is radiated onto the measuring volume. A quasi-magnetic field with a flux density of $B_{01eff}$ consequently forms in z direction above the measuring volume on the time scale for the laser pulses, which are mentioned below.

An additional laser beam that is not rectified and has a frequency $f_{02}$, a cycle duration $\tau_{02}$ and a wavelength $\gamma_{02}$ is radiated according to FIG. 5 onto the measuring volume, in the direction of the first laser beam, thereby causing an additional magnetic field to form in z direction above the measuring volume on the time scale for the laser pulses, with a flux density $B_{02}$. The second laser beam is arranged such that a quasi-static zero crossing of the magnetic field $B_{02}$ appears as precisely as possible in the center of the sample volume.

As is obvious from FIG. 5, the intensity of the magnetic field gradient in the measuring volume can be adjusted depending on the frequency $f_{02}$, the cycle duration $\tau_{02}$ and the wavelength $\gamma_{02}$.

In the direction of the two laser beams, the measuring volume is then admitted with a series of laser pulses having a frequency $f_l$, a cycle duration $\tau_1$, a wavelength $\gamma_1$, a pulse duration $\tau_{p1}$ and an adjustable polarization $p_1$, such that each laser pulse impinges on the measuring volume at the location of the quasi-constant magnetic field $B_{01eff}$ and the strongest magnetic field gradient $$\frac{\partial B_{02}}{\partial y} = \max \text{ or } \frac{\partial B_{02}}{\partial x} = \max.$$

In the process, the frequency $f_1$ is selected such that it exceeds the frequency $f_{02}$ of the second laser beam by at least a factor of $10^2$ and preferably $10^3$. In contrast, the frequency $f_{01}$ exceeds the frequency $f_l$ by at least a factor of $10^2$ and preferably $10^3$.

If the Larmor requirement according to the equation 1 is met, at least one sample volume contained within the measuring volume emits a nuclear magnetic resonance signal in response to being admitted, wherein this signal can be detected with the aid of a detector focused onto the measuring volume.

Figure 6:
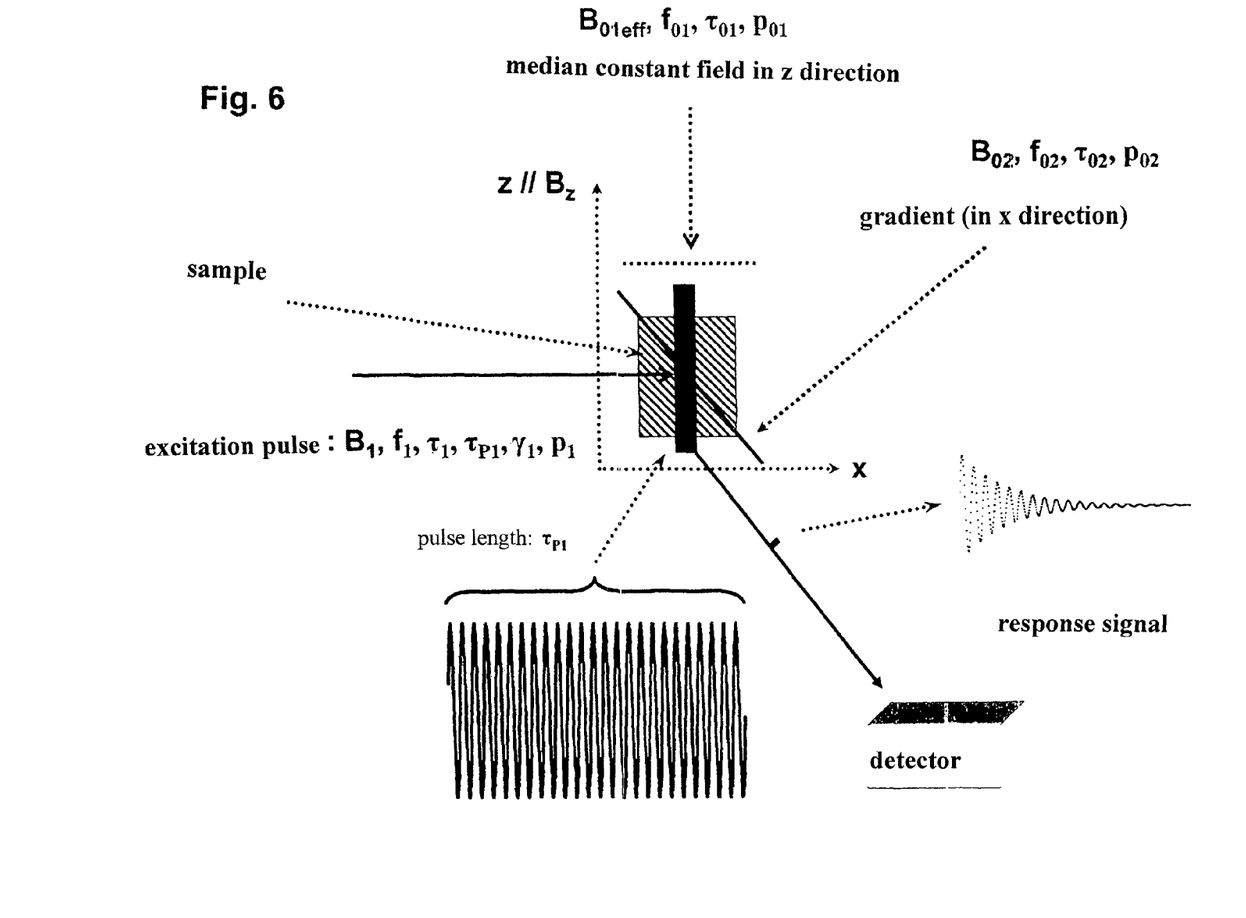
FIG. 6 An enlarged representation of FIG. 5.

FIG. 6 is an enlarged view, showing the situation of the sample volume to the examined and the area immediately surrounding it. The enlarged, emphasized amplitude-constant input pulse with a frequency $f_1$, a cycle duration $\tau_1$, and a wavelength $\gamma_1$ causes the decaying response signal, indicated on the right side of the image, which is coming from the sample volume and can be recorded with the aid of the detector.

Figure 7:
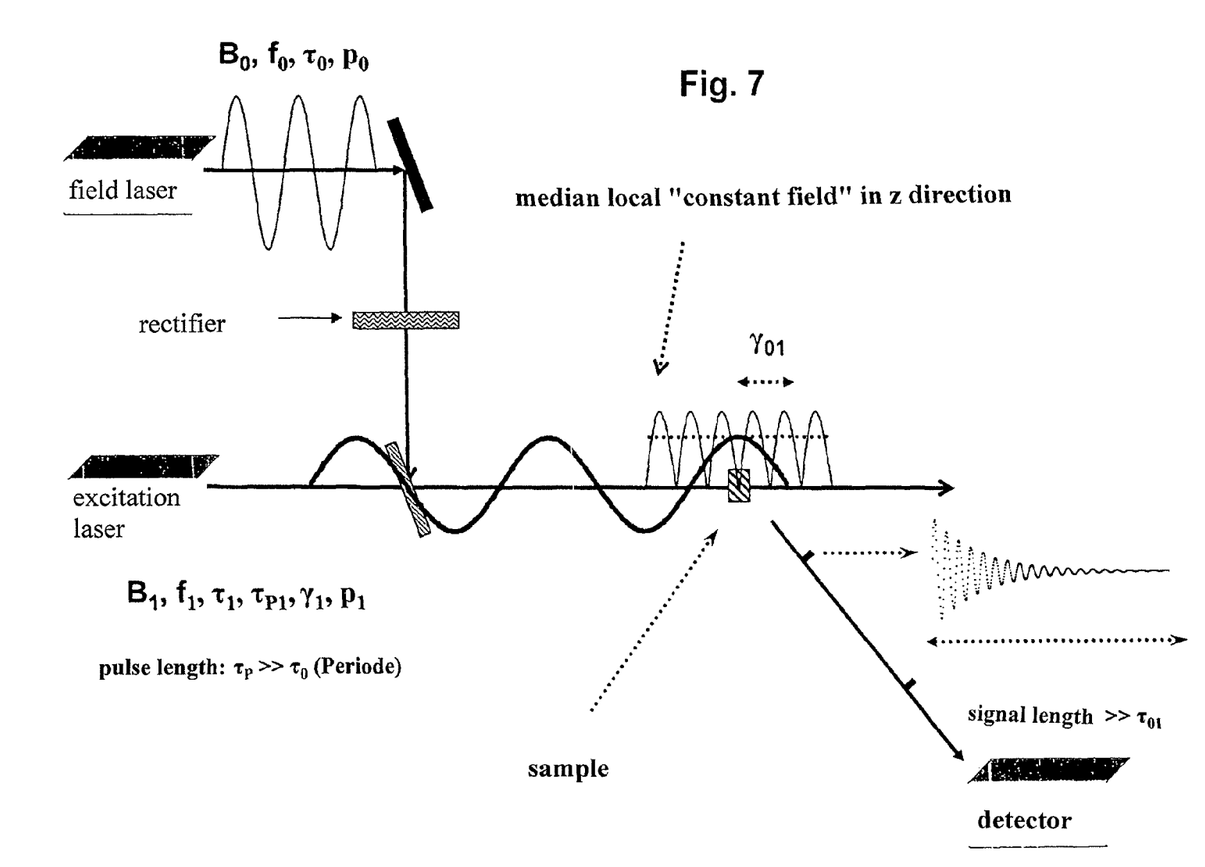
FIG. 7 A simple device for the spectroscopy according to the measure ii)

FIG. 7 shows a simplified arrangement for the micro-spectroscopy/nano-spectroscopy and/or the microscopy/nanoscopy. By way of optical media, deflection mirrors, rectifiers and semi-transparent mirrors, the first laser beam (frequency $f_0$, cycle duration $\tau_0$ and wavelength $\gamma_0$) is merged with the laser pulses (frequency cycle duration $\tau_1$, pulse duration $\tau_{p1}$ and wavelength $\gamma_1$), so that in the measuring volume the sample can be acted upon simultaneously by the quasi-constant magnetic field $B_{01eff}$, which is here oriented in z direction, and centrally also by the laser pulse. This laser pulse has a cycle duration exceeding that of the first laser beam by at least $10^2$. Furthermore shown are the magnetic field components $B_i$ for the laser pulses with the respectively associated frequencies $f_i$.

Figure 8:
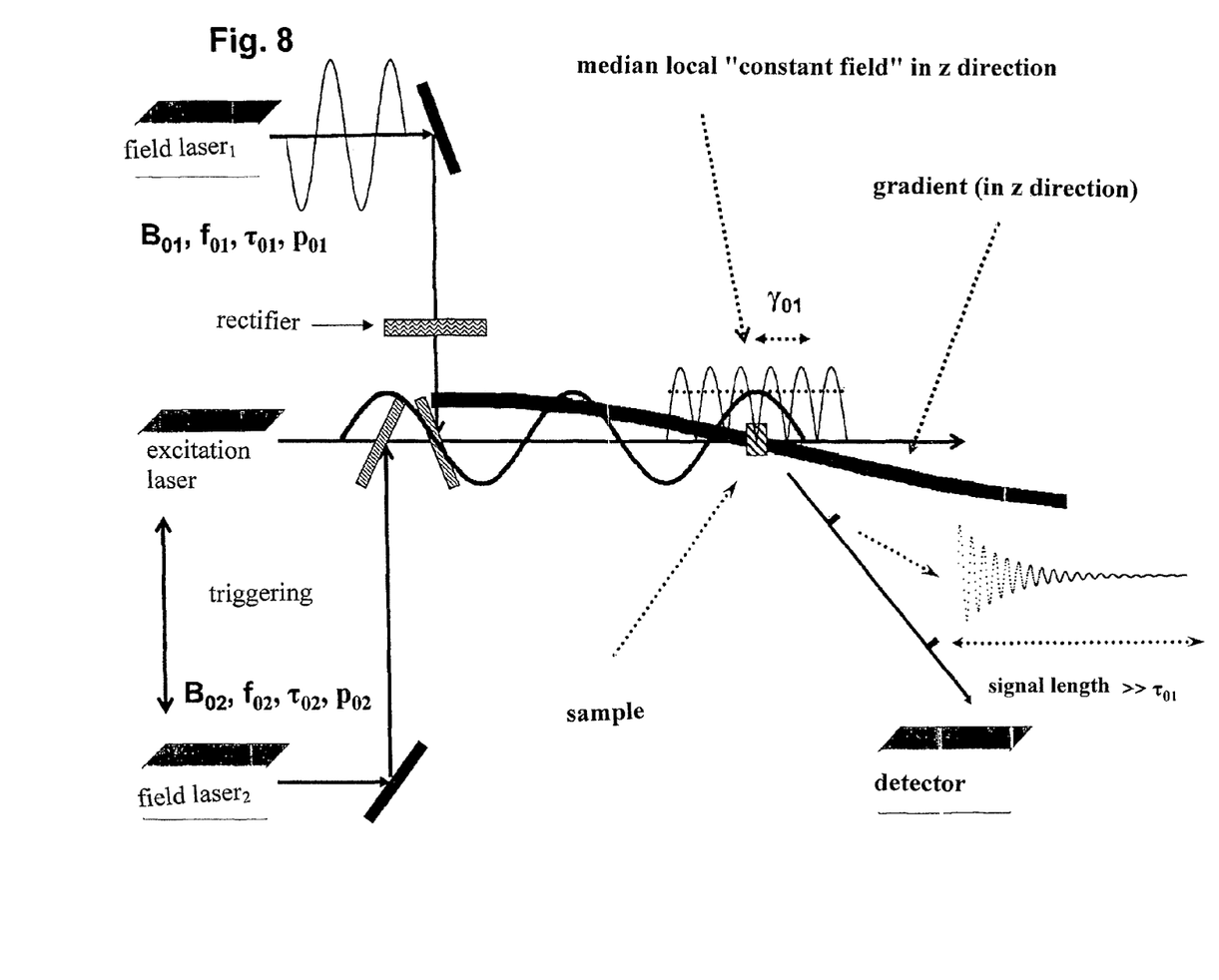
FIG. 8 A device for the micro-spectroscopy according to the measure ii).

FIG. 8 shows the same configuration as FIG. 5, but expanded by the representation of the radiation sources. The left side of the picture shows on the top and on the bottom the two field lasers for generating the first and the second laser beams while the excitation laser for generating the laser pulses is shown in the center. The two light beams and the laser pulses are merged via the deflection mirror, a rectifier and semi-transparent mirrors and are focused onto the measuring volume. The manner in which the beam is deflected is shown as example, wherein a different type of arrangement is also possible, as long as it ensures the merging and localizing of the two laser beams and the laser pulses in the volume of the sample to be examined.

An exemplary computation for the measure ii), using the conditions requiring the rectifying of $B_{01}$, is intended to provide a quantitative illustration of the method according to the invention. For locally generating the effective quasi-static magnetic field $B_{01eff}$, an IR laser with an operating frequency $f_{01}=10^{13}$ Hz is used. A pulsed maser ($\tau_{p1} \approx 10^{-10}$ s; $f_{01} \approx 101^3$ Hz) having an operating frequency $f_1=1011$ Hz is used for the excitation signal.

Using the equation 1, the following results are obtained for the magnetic field intensity for proton resonance ($\gamma_{proton}=42.5 \cdot 10^6$ MHz/T) and an averaging factor $\xi \leq 1.0$:

$$B_{01eff} = \xi \cdot B_{01} = \frac{2\pi \int f_1}{\gamma_{core}} \sim 15 kT. \quad (9)$$

The laser field intensity with $\xi=0.64$ is thus:

$$I_{01} = \frac{1}{2} \cdot \frac{c}{\mu_0} |B_{01}^2| \approx 64 \frac{GW}{\mu m^2} \quad (10)$$

Using $B_{02} \approx 10^{-3} B_{01}$ and $\gamma_{02} \approx 10^3 \gamma_1$, the magnetic field gradient can be estimated as follows:

$$\frac{\partial B_{02}}{\partial x_1} \approx \frac{\partial}{\partial x_1}\left(10^{-3} B_{01} \sin e\left(\frac{2\pi}{10^3 \lambda_1} x_i\right)\right) \approx \quad (11)$$

$$10^{-6} B_{01} \frac{2\pi}{\lambda_1} \approx 4.9 \frac{10^{-5} T}{\mu m} = 0.5 \frac{G}{\mu m}$$

A corresponding excitation width is required for exciting the energy levels:

$$\Delta f_1 \sim 10^{-3} f_{01} \approx 10^{10} Hz, \quad (12)$$

resulting in an estimated excitation pulse (90°—pulse duration) of $10^{-10}$ s. The following value is thus obtained for the $B_1$ field intensity:

$$0.25 \approx \gamma_H B_1 \cdot 10^{-10} s \rightarrow B_1 = 59T. \quad (13)$$

The following value is thus obtained for the intensity of the maser:

$$I_1 = \frac{1}{2} \cdot \frac{c}{\mu_0} |B_1^2| \approx 410 \frac{kW}{\mu m^2}. \quad (14)$$

The Table 2 below lists the order of magnitude for several field properties with rectified $B_{01}$ field:

| frequencies in Hz | | magnetic fields in T | | | gradient in G/µm | intensities in W/µm² | |
|---|---|---|---|---|---|---|---|
| $f_{01}$ | $f_1$ | $B_{01eff} = \xi \cdot B_{01}$ | $B_1$ | | $\partial_x B_{02}$ | $I_{01}$ | $I_1$ |
| $10^9$ | $10^7$ | 1.5 | $5.9 \cdot 10^{-3}$ | | $4.9 \cdot 10^{-9}$ | $6.4 \cdot 10^2$ | $4.1 \cdot 10^{-3}$ |
| $10^{10}$ | $10^8$ | $1.5 \cdot 10^1$ | $5.9 \cdot 10^{-2}$ | | $4.9 \cdot 10^{-7}$ | $6.4 \cdot 10^4$ | $4.1 \cdot 10^{-1}$ |
| $10^{11}$ | $10^9$ | $1.5 \cdot 10^2$ | $5.9 \cdot 10^{-1}$ | | $4.9 \cdot 10^{-5}$ | $6.4 \cdot 10^6$ | $4.1 \cdot 10^1$ |

A degree of freedom is provided for the structural arrangement. For example, if optical fibers are used to generate the laser radiation, it is not absolutely necessary to have several laser sources that must be triggered to each other since the radiation of a single source with different fiber arrangements can be adjusted accordingly.

It is also possible to generate a defined phase position for different states of polarization, so that the phase-sensitive quadrature detection can be used which is generally used for the nuclear magnetic resonance (NMR) (for example, see also Electronics Letters, 15, 1979, 615).

The invention claimed is:

1. A method for examining the nuclear magnetic resonance in a sample volume, contained in a measuring volume, said method comprising the steps of:
    a) generating at least one packet of laser pulses with the aid of an excitation laser;
    b) radiating the measuring volume with the at least one packet of laser pulses so that the at least one packet of laser pulses on the measuring volume when a quasi-static magnetic field appears within the measuring volume, thereby causing the sample volume within the measuring volume to transmit a response signal to the at least one packet of laser pulses, provided the resonance conditions for nuclear spins therein are met; and
    c) receiving the response signal from the sample volume in at least one detector,
    wherein the quasi-static magnetic field within the measuring volume is is generated by
    i) admitting the measuring volume with a low-frequency first laser beam for which the wavelength exceeds the wavelength of the excitation laser by at least a factor of $10^2$, thereby generating in the measuring volume a periodically changeable magnetic field with a flux density $B_{01}$ and causing the amplitude of the magnetic field within the measuring volume to measure at least 90% of its maximum value, or
    ii) admitting the measuring volume with a high-frequency first laser beam for which the frequency exceeds the frequency of the excitation laser by at least a factor of $10^2$, wherein the laser beam is subjected to a rectification prior to impinging on the measuring volume, thereby generating in the measuring volume a quasi-static magnetic field which has over at least 10 cycles an effective average constant flux density $B_{01eff}$ for which the spatial and time average is not equal to zero.

2. The method according to claim 1, wherein the quasi-static magnetic field is generated in step (i), by generating the at least one packet of laser pulses by an excitation laser with a frequency of $10^9$ to $10^{15}$ Hz and by generating the low-frequency first laser beam with a first field laser having a frequency of $10^7$ to $10^{13}$ Hz.

3. The method according to claim 1, wherein the quasi-static magnetic field is generated in step (ii), by generating the at least one packet of laser pulses by an excitation laser with a wavelength of $10^7$ to $10^9$ Hz and by generating the high-frequency first laser beam by a first field laser having a wavelength of $10^9$ to $10^{11}$ Hz and subjecting the high-frequency first laser beam to an electronic rectification.

4. The method according to claim 1, including generating at least one additional laser beam for which the wavelength corresponds to the wavelength of the low-frequency first laser beam and for which the phase of the at least one additional laser beam differs from the phase of the low-frequency first laser beam by 90°±5°, and wherein step b) includes simultaneously admitting the measuring volume with the at least one additional laser beam, thereby generating in the measuring volume at least one additional periodically variable magnetic field with a flux density $B_{0i}$ with i=1 or 3 which has a gradient.

5. The method according to claim 4, including generating the at least one additional laser beam
    by at least one additional field laser or
    by branching off from the low-frequency first laser beam with the aid of at least one beam divider, arranged in the beam path, and a Π/2 delay line.

6. A device for examining nuclear magnetic resonance in a sample volume, contained in a measuring volume, comprising
    at least one field laser for generating a first laser beam;
    an excitation laser for generating laser pulses;
    a controller to control the relative phase between the field laser and the excitation laser; and
    a guide to guide the first laser beam and the laser pulses along a beam path to the measuring volume that contains the sample.

7. The device according to claim 6, further including at least one beam divider and at least one delay line additionally arranged in the beam path.

8. The device according to claim 6, further including at least one rectifier arranged in the beam path.

* * * * *